United States Patent
Okuno et al.

(10) Patent No.: US 8,816,322 B2
(45) Date of Patent: Aug. 26, 2014

(54) GROUP III NITRIDE SEMICONDUCTOR LIGHT-EMITTING DEVICE AND PRODUCTION METHOD THEREFOR

(71) Applicant: Toyoda Gosei Co., Ltd., Kiyosu (JP)

(72) Inventors: Koji Okuno, Kiyosu (JP); Shunsuke Aoyama, Kiyosu (JP)

(73) Assignee: Toyoda Gosei Co., Ltd., Kiyosu-Shi, Aichi-Ken (JP)

( * ) Notice: Subject to any disclaimer, the term of this patent is extended or adjusted under 35 U.S.C. 154(b) by 0 days.

(21) Appl. No.: 13/724,385

(22) Filed: Dec. 21, 2012

(65) Prior Publication Data

US 2013/0161586 A1 Jun. 27, 2013

(30) Foreign Application Priority Data

Dec. 23, 2011 (JP) .................................. 2011-282436

(51) Int. Cl.
*H01L 29/06* (2006.01)
(52) U.S. Cl.
USPC .................. 257/13; 257/18; 257/103; 438/47
(58) Field of Classification Search
CPC .......... H01L 33/12; H01L 33/06; H01L 33/32
USPC .................................. 257/13, 18, 103; 438/47
See application file for complete search history.

(56) References Cited

U.S. PATENT DOCUMENTS 7,700,940 B2 * 4/2010 Sakai et al. ..................... 257/14
2010/0195687 A1 8/2010 Okamoto et al.

FOREIGN PATENT DOCUMENTS

JP 2010-177651 A 8/2010

* cited by examiner

*Primary Examiner* — Tu-Tu Ho
(74) *Attorney, Agent, or Firm* — McGinn IP Law Group, PLLC

(57) ABSTRACT

The present invention provides a Group III nitride semiconductor light-emitting device which is intended to relax stress applied to a light-emitting layer. The light-emitting device includes an MQW layer, and an n-side superlattice layer formed below the MQW layer. The n-side superlattice layer is formed by repeatedly depositing layer units, each unit including an InGaN layer, a GaN layer, and an n-GaN layer which are sequentially deposited from the side of the sapphire substrate. In the n-side superlattice layer, an InGaN layer more proximal to the MQW layer has a higher In compositional proportion. The In compositional proportion of the InGaN layer (which is most proximal to the MQW layer) of the n-side superlattice layer is 70% to 100% of the In compositional proportion of the InGaN layer (which is most proximal to the n-side superlattice layer) of the MQW layer.

7 Claims, 6 Drawing Sheets t1<t2<t3

GROUP III NITRIDE SEMICONDUCTOR LIGHT-EMITTING DEVICE AND PRODUCTION METHOD THEREFOR

BACKGROUND OF THE INVENTION

1. Field of the Invention

The present invention relates to a Group III nitride semiconductor light-emitting device. More particularly, the present invention relates to a Group III nitride semiconductor light-emitting device in which the stress applied to a light-emitting layer is relaxed.

2. Background Art

In recent years, there have been put into practice light-emitting devices employing a Group III nitride semiconductor (e.g., GaN), including high-brightness blue LEDs. Generally, a light-emitting device includes an n-electrode, an n-type cladding layer, a light-emitting layer, a p-type cladding layer, and a p-electrode, and these layers have different lattice constants.

In the case where, for example, an upper layer is formed on a lower layer through epitaxial crystal growth for producing a semiconductor light-emitting device, when the lattice constant of the upper layer greatly differs from that of the lower layer, difficulty is encountered in growing the crystal forming the upper layer. In many cases, the thus-grown crystal exhibits poor crystallinity. In addition, stress is applied between the lower layer and the upper layer even after production of the semiconductor light-emitting device. A piezoelectric field is generated in the layer to which stress is applied. Particularly when a piezoelectric field is generated in a light-emitting layer, the light-emitting layer exhibits an energy band slope. Therefore, the probability of recombination of electrons and holes is reduced; i.e., emission output is reduced.

In view of the foregoing, there has been developed a technique for relaxing stress applied to a light-emitting layer. For example, Patent Document 1 discloses a semiconductor laser device including an n-type guide layer and a p-type guide layer, wherein an InGaN layer more proximal to an active layer has a larger thickness (see paragraphs [0055] and [0056] and FIG. 10 of Patent Document 1). In the device, average In compositional proportion is regulated by changing the thicknesses of layers forming a superlattice structure.

Patent Document 1: Japanese Patent Application Laid-Open (kokai) No. 2010-177651

However, such a technique is still unsatisfactory for relaxing stress applied to a light-emitting layer. The lower the stress applied to a light-emitting layer, the more preferable the resultant device. This is because, when the stress applied to the light-emitting layer is reduced, the light-emitting device accordingly exhibits low energy band slope.

SUMMARY OF THE INVENTION

The present invention has been accomplished for solving the aforementioned problems involved in conventional techniques. Accordingly, an object of the present invention is to provide a Group III nitride semiconductor light-emitting device which is intended to relax stress applied to a light-emitting layer.

In a first aspect of the present invention for solving the aforementioned problems, there is provided a Group III nitride semiconductor light-emitting device comprising an underlying layer formed of a Group III nitride semiconductor, a strain relaxation layer formed on the underlying layer, and a light-emitting layer formed on the strain relaxation layer. The light-emitting layer is formed by depositing a barrier layer and an In-containing well layer. The strain relaxation layer is formed of a superlattice layer including three or more layer units, each unit including at least an InGaN layer and a GaN layer. Among the layer units, a layer unit more proximal to the light-emitting layer includes an InGaN layer having a higher In compositional proportion, and the layer unit most proximal to the light-emitting layer includes an InGaN layer having an In compositional proportion which is 70% to 100% of the In compositional proportion of the well layer of the light-emitting layer.

In the Group III nitride semiconductor light-emitting device, strain is relaxed at the boundary between the strain relaxation layer and the light-emitting layer. Therefore, stress applied to the light-emitting layer is relaxed. Thus, the light-emitting layer has a strain-reduced band structure. Accordingly, the Group III nitride semiconductor light-emitting device exhibits favorable light emission performance. In addition, each layer formed through epitaxial growth exhibits good crystallinity. Thus, light emission performance is further improved.

Meanwhile, lattice constant gradually changes in the strain relaxation layer from a layer on the side of a substrate to a layer on the side of the light-emitting layer. Thus, stress is not concentrated on a specific layer of the strain relaxation layer. Therefore, the crystallinity of the strain relaxation layer is not impaired. Thus, the crystallinity of the light-emitting layer, which is epitaxially grown on the strain relaxation layer, is also not impaired.

A second aspect of the present invention is drawn to a specific embodiment of the Group III nitride semiconductor light-emitting device, wherein, in the layer units, an InGaN layer more proximal to the light-emitting layer has a larger thickness. In this case, the average In compositional proportion of a layer unit proximal to the light-emitting layer is nearly equal to that of a single quantum well structure of the light-emitting layer. Therefore, strain applied to the light-emitting layer is relaxed. Thus, light emission performance can be improved.

A third aspect of the present invention is drawn to a specific embodiment of the Group III nitride semiconductor light-emitting device, wherein the GaN layers of all the layer units have the same thickness.

A fourth aspect of the present invention is drawn to a specific embodiment of the Group III nitride semiconductor light-emitting device, wherein the layer of the layer units that is in contact with the light-emitting layer is an n-GaN layer. This is for the purpose of confining holes in the light-emitting layer, and improving the crystallinity of the light-emitting layer grown on the n-GaN layer.

A fifth aspect of the present invention is drawn to a specific embodiment of the Group III nitride semiconductor light-emitting device, wherein the layer of the layer units that is in contact with the underlying layer is an InGaN layer. Since the InGaN layer, which is the first lattice mismatch layer, has low In compositional proportion and a lattice constant nearly equal to that of GaN, the InGaN layer receives less strain from the underlying layer. Therefore, strain transmission to the strain relaxation layer formed on the InGaN layer is suppressed.

A sixth aspect of the present invention is drawn to a specific embodiment of the Group III nitride semiconductor light-emitting device, wherein the layer units include an AlGaN layer.

A seventh aspect of the present invention is drawn to a specific embodiment of the Group III nitride semiconductor light-emitting device, wherein the underlying layer is a layer for preventing electrostatic breakdown of each semiconductor layer (hereinafter the layer may be referred to as an "electrostatic-breakdown-voltage-improving layer"). The electrostatic-breakdown-voltage-improving layer also exhibits a strain relaxation effect.

In an eighth aspect of the present invention, there is provided a method for producing a Group III nitride semiconductor light-emitting device, comprising a step of forming an underlying layer from a Group III nitride semiconductor; a step of forming a superlattice layer on the underlying layer; and a step of forming a light-emitting layer on the superlattice layer, wherein, in the superlattice layer formation step, the superlattice layer is formed by depositing three or more layer units, each unit including at least an InGaN layer and a GaN layer, in a repeated manner so that an InGaN layer of the layer units more proximal to the light-emitting layer has a higher In compositional proportion.

Lattice constant gradually changes in the InGaN layers of the layer units from the side of the underlying layer to the side of the light-emitting layer. Therefore, strain can be gradually relaxed in the layer units. Since a new semiconductor layer is formed on the strain-relaxed layer, the newly formed semiconductor layer exhibits favorable crystallinity.

A ninth aspect of the present invention is drawn to a specific embodiment of the Group III nitride semiconductor light-emitting device production method, wherein, in the superlattice layer formation step, the temperature of a substrate is lowered as formation of the InGaN layers of the layer units proceeds from the side of the underlying layer to the side of the light-emitting layer. According to this method, the In compositional proportion of the InGaN layers of the layer units is easily changed gradually.

According to the present invention, there is provided a Group III nitride semiconductor light-emitting device which is intended to relax stress applied to a light-emitting layer.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with the accompanying drawings, in which.

DETAILED DESCRIPTION OF PREFERRED EMBODIMENTS

Figure 1:
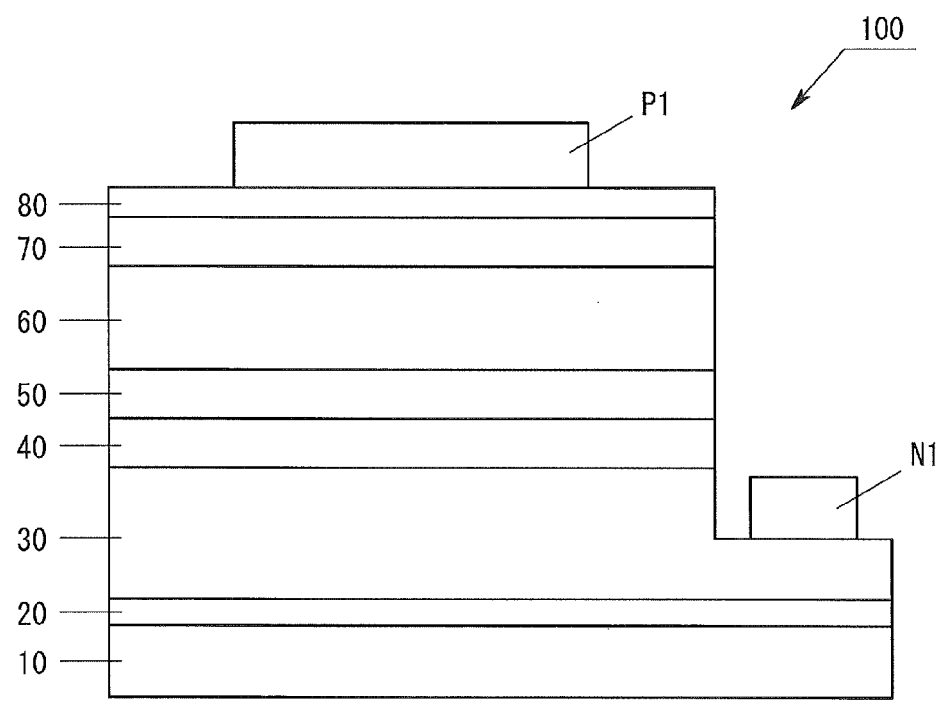
FIG. 1 is a schematic diagram showing the structure of a Group III nitride semiconductor light-emitting device according to embodiments.

Specific embodiments of the present invention will next be described with reference to the drawings by taking, as an example, the case where a light-emitting device is produced. However, the present invention is not limited to the embodiments. That is, the present invention can be applied to any other In-containing Group III nitride semiconductor light-emitting device. Needless to say, the structure of each layer forming the light-emitting device may differ from that exemplified in the below-described embodiments. The thickness of each layer which is schematically shown in the drawings does not correspond to its actual value.

Embodiment 1

1. Semiconductor Device

Now will be described, with reference to FIG. 1, a light-emitting device 100 produced through the semiconductor device production method according to the present embodiment. The light-emitting device 100 is a semiconductor device formed of a Group III nitride semiconductor. As shown in FIG. 1, the light-emitting device 100 includes a sapphire substrate 10; a low-temperature buffer layer 20; an n-type contact layer 30; an n-type ESD layer (electrostatic discharge layer) 40; an n-side superlattice layer 50; an MQW layer (multiple quantum well layer) 60 serving as a light-emitting source; a p-type cladding layer 70; and a p-type contact layer 80, the layers 20 to 80 being formed on the sapphire substrate 10 in this order. An n-electrode N1 is formed on the n-type contact layer 30. A p-electrode P1 is formed on the p-type contact layer 80.

The aforementioned respective layers are formed through MOCVD on one surface of the sapphire substrate 10. The surface of the sapphire substrate 10 is preferably embossed for the purpose of improving light extraction performance. The sapphire substrate may be replaced with another growth substrate formed of, for example, SiC, ZnO, Si, or GaN. The low-temperature buffer layer 20 is provided for forming crystal nuclei of high density on the sapphire substrate 10. Thus, the low-temperature buffer layer 20 facilitates growth of a GaN layer having a flat surface. Examples of the material of the low-temperature buffer layer 20 include AlN and GaN.

The n-type contact layer 30 is actually in contact with the n-electrode N1. The n-type contact layer 30 is formed of n-GaN. The Si concentration of the layer 30 is $1 \times 10^{18}/cm^3$ or more. The n-type contact layer 30 may be formed of a plurality of layers having different carrier concentrations for the purpose of improving the ohmic contact between the n-type contact layer 30 and the n-electrode.

The n-type ESD layer 40 serves as an electrostatic-breakdown-voltage-improving layer for preventing electrostatic breakdown of each semiconductor layer. The n-type ESD layer 40 has a layered structure including a non-doped GaN layer and an Si-doped n-GaN layer. Preferably, the n-type ESD layer 40 is doped with Si so as to attain a carrier concentration of $1 \times 10^{18}/cm^3$ or more.

The n-side superlattice layer 50 serves as a strain relaxation layer for relaxing stress applied to the MQW layer 60. More specifically, the n-side superlattice layer 50 has a superlattice structure. The n-side superlattice layer 50 is formed on the n-type ESD layer 40. As described hereinbelow, the n-side superlattice layer 50 is formed by repeatedly depositing layer units, each unit including an InGaN layer, a GaN layer, and an n-GaN layer. As shown in FIG. 1, the n-side superlattice layer 50 is located between the n-type ESD layer 40 and the MQW layer 60, and is in contact with the n-type ESD layer 40 and the MQW layer 60.

The MQW layer 60 serves as a light-emitting layer which emits light through recombination of electrons and holes. Thus, the MQW layer 60 has a multiple quantum well structure formed by alternately depositing a well layer having a small bandgap and a barrier layer having a large bandgap. The MQW layer 60 is formed on the n-side superlattice layer 50. The well layer may be formed of InGaN, and the barrier layer may be formed of AlGaN. Thus, the well layer contains In. The barrier layer may be formed of AlInGaN. Alternatively, the MQW layer 60 may be formed of any combination of these layers; for example, the layer 60 may be formed of repeating layer units, each including four or more layers.

The p-type cladding layer 70 is provided for preventing diffusion of electrons to the p-type contact layer 80. The p-type cladding layer 70 is formed by alternately depositing a layer unit including a p-InGaN layer and a layer unit including a p-AlGaN layer. The number of repeating layer units is 7. The number of repeating layer units may be 3 to 50.

The p-type contact layer 80 is actually in contact with the p-electrode P1. The p-type contact layer 80 is formed of p-GaN doped with Mg. In the light-emitting device 100, the p-type contact layer 80 is positioned on the side opposite the side of the sapphire substrate 10.

The p-type contact layer 80 has a thickness of 100 Å to 1,000 Å. The p-type contact layer 80 is doped with Mg at a concentration of $1 \times 10^{19}/cm^3$ to $1 \times 10^{22}/cm^3$. The p-type contact layer 80 may be formed of a plurality layers such that a layer more proximal to the p-electrode P1 is doped with Mg at a higher concentration.

Figure 2:
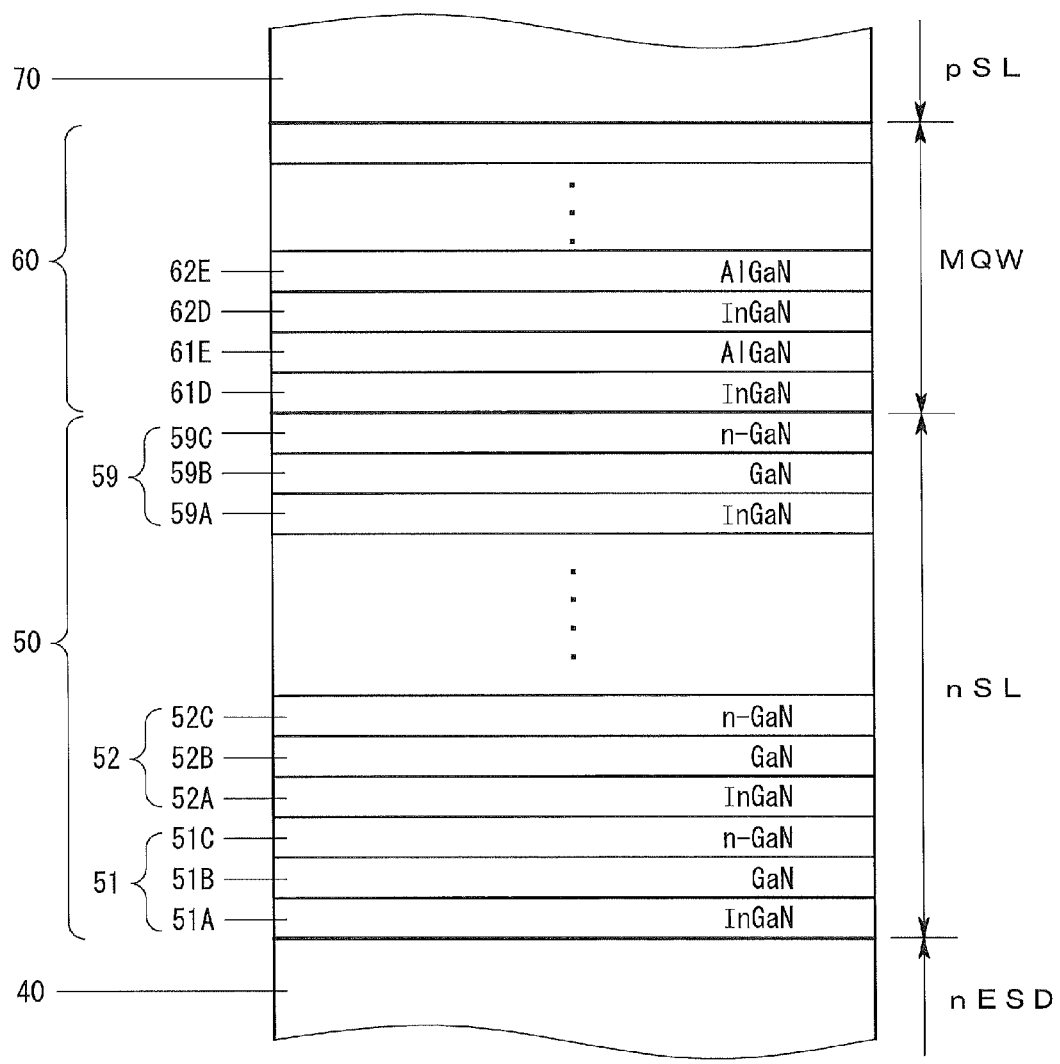
FIG. 2 is a diagram showing the layered structure of an n-side superlattice layer of the Group III nitride semiconductor device according to Embodiment 1.

2. n-Side Superlattice Layer
2-1. Layered Structure of n-Side Superlattice Layer Now will be described, with reference to FIG. 2, the layered structure according to the present embodiment, including the n-side superlattice layer 50, the MQW layer 60, and layers in the vicinity thereof. The n-side superlattice layer 50 (i.e., strain relaxation layer) includes layer units 51 and 52 to 59. As shown in FIG. 2, the n-side superlattice layer 50 is formed by repeatedly depositing the layer units 51 and 52 to 59. The number of repeating layer units is 5. The number of repeating layer units may be 3 to 20.

As shown in FIG. 2, the layer unit 51 is formed by depositing an InGaN layer (hereinafter may be referred to as "layer A"), a GaN layer (hereinafter may be referred to as "layer B"), and an n-GaN layer (hereinafter may be referred to as "layer C") sequentially from the side of the n-type ESD layer 40 to the side of the MQW layer 60. The layer units 52 to 59 are formed in the same manner as the layer unit 51.

Layer A (InGaN layer 51A and 52A to 59A) have a thickness of 7 Å. That is, the InGaN layers 51A and 52A to 59A have the same thickness. The thickness of layer A is constant between the layer units 51 and 52 to 59. The constant thickness may be another value. For example, the constant thickness of layer A may be changed to fall within a range of 5 Å to 10 Å.

Layer B (GaN layer 51B and 52B to 59B) have a thickness of 15 Å. That is, the GaN layers 51B and 52B to 59B have the same thickness (i.e., constant thickness of 15 Å). The constant thickness (15 Å) of layer B may be changed to fall within a range of 3 Å to 40 Å.

Layer C (n-GaN layer 51C and 52C to 59C) has a thickness of 20 Å. That is, the n-GaN layers 51C and 52C to 59C have the same thickness. The thickness of layer C may be changed to fall within a range of 3 Å to 40 Å.

Specifically, the n-side superlattice layer 50 has a layered structure formed by repeatedly depositing layer units, each unit including layer C (n-GaN layer: 20 Å), layer B (GaN layer: 15 Å), and layer A (InGaN layer: 7 Å), the layers C to A being sequentially provided from the side of the MQW layer 60. Therefore, the layer which is in contact with the MQW layer 60 is formed of n-GaN, and the layer which is in contact with the n-type ESD layer 40 is formed of InGaN.

2-2. In Compositional Proportion of Layer A (InGaN Layer) of n-Side Superlattice Layer As described above, the n-side superlattice layer 50 has a superlattice structure for relaxing stress applied to the MQW layer 60.

Now will be described the In compositional proportion of an InGaN layer of the MQW layer 60. The InGaN layer 61D has a composition of $In_{0.2}Ga_{0.8}N$. The InGaN layer 61D, which is included in the MQW layer 60, is in contact with the n-side superlattice layer 50.

Now will be described the In compositional proportion of layer A (InGaN layer) of the n-side superlattice layer 50. The InGaN layer 59A has a composition of $In_{0.18}Ga_{0.82}N$. The InGaN layer 59A is included in the layer unit 59 of the n-side superlattice layer 50 which is in contact with the MQW layer 60.

The InGaN layer 52A has a composition of $In_{0.06}Ga_{0.94}N$. The InGaN layer 51A has a composition of $In_{0.02}Ga_{0.98}N$. The InGaN layer 51A is included in the layer unit 51 which is in contact with the n-type ESD layer 40.

2-2-1. In Compositional Proportion of Layer a (InGaN Layer) Most Proximal to Light-Emitting Layer The In compositional proportion of the InGaN layer 59A of the n-side superlattice layer 50 is 90% of the In compositional proportion of the InGaN layer 61D of the MQW layer 60. The In compositional proportion of the InGaN layer 59A is preferably 70% to 100% of the In compositional proportion of the InGaN layer 61D of the MQW layer 60. The In compositional proportion of the InGaN layer 59A is more preferably 80% to 100% of the In compositional proportion of the InGaN layer 61D of the MQW layer 60. In this case, the In compositional proportion of the InGaN layer 59A, which is, in the n-side superlattice layer 50, the InGaN layer most proximal to the MQW layer 60, is almost the same as the In compositional proportion of the InGaN layer 61D of the MQW layer 60. Therefore, stress applied to the MQW layer 60 can be further relaxed. In the MQW layer 60, the InGaN layer 61D has the same In compositional proportion as the InGaN layer 62D. Thus, all the InGaN layers included in the MQW layer 60 have the same In compositional proportion.

In the n-side superlattice layer 50, the InGaN layer 59A is the layer A (InGaN layer) most proximal to the MQW layer 60. Meanwhile, in the MQW layer 60, the InGaN layer 61D is the InGaN layer most proximal to the n-side superlattice layer 50.

Therefore, there is a small difference in lattice constant between the InGaN layer 59A of the n-side superlattice layer 50 and the InGaN layer 61D of the MQW layer 60. Thus, strain is reduced between the MQW layer 60 (i.e., light-emitting layer) and the n-side superlattice layer 50; i.e., stress applied to the MQW layer 60 is relaxed.

2-2-2. Change in In Compositional Proportion of Layer A (InGaN Layer) of n-Side Superlattice Layer The In compositional proportion of the InGaN layer 59A is higher than that of the InGaN layer 52A. The In compositional proportion of the InGaN layer 52A is higher than that of the InGaN layer 51A. That is, the In compositional proportion of layer A (InGaN layer) decreases from the side of the MQW layer 60 to the side of the n-type ESD layer 40.

Thus, in the n-side superlattice layer 50, the In compositional proportion of layer A (InGaN layer) increases as the corresponding layer unit becomes distant from the n-type ESD layer 40 (i.e., becomes proximate to the MQW layer 60). That is, the layer A (InGaN layer) of the layer unit 59, which is most proximal (among the layer units 51 and 52 to 59) to the MQW layer 60, has the highest In compositional proportion. This is for the purpose of adjusting the lattice constant of layer A (InGaN layer) of the n-side superlattice layer 50 so that layer A (InGaN layer) more proximal to the MQW layer 60 has a larger lattice constant.

As described above, stress applied to the MQW layer 60 is relaxed. Therefore, the energy band slope of the MQW layer 60 attributed to stress is reduced, as compared with conventional cases. Also, the light-emitting device 100 exhibits excellent electrical properties and optical properties.

3. Semiconductor Device Production Method

In the semiconductor device production method according to the present embodiment, the aforementioned respective layers were formed through epitaxial crystal growth by metal-organic chemical vapor deposition (MOCVD). The steps of the method will next be described with reference to FIGS. 3 and 4.

The carrier gas employed in the method is hydrogen ($H_2$), nitrogen ($N_2$), or a gas mixture of hydrogen and nitrogen ($H_2+N_2$). Ammonia gas ($NH_3$) was employed as a nitrogen source. Trimethylgallium ($Ga(CH_3)_3$, hereinafter may be referred to as "TMG") was employed as a Ga source. Trimethylindium ($In(CH_3)_3$, hereinafter may be referred to as "TMI") was employed as an In source. Trimethylaluminum ($Al(CH_3)_3$, hereinafter may be referred to as "TMA") was employed as an Al source. Silane ($SiH_4$) was employed as an n-type dopant gas. Cyclopentadienylmagnesium ($Mg(C_5H_5)_2$, hereinafter may be referred to as "$Cp_2Mg$") was employed as a p-type dopant gas.

3-1. Step of Forming Low-Temperature Buffer Layer

In the present embodiment, the sapphire substrate 10 was provided, and the sapphire substrate 10 was placed in an MOCVD furnace. Subsequently, the sapphire substrate 10 was subjected to cleaning in a hydrogen gas atmosphere, to thereby remove deposits from the surface of the sapphire substrate 10. Then, the substrate temperature was elevated to 400° C., and the AlN low-temperature buffer layer 20 was formed on the sapphire substrate 10.

3-2. Step of Forming n-Type Contact Layer

Figure 3A:
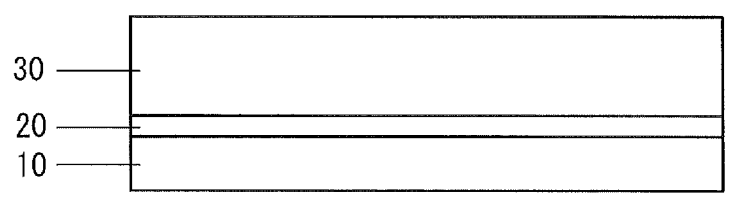
FIGS. 3A to 3C are diagrams illustrating a method for producing the Group III nitride semiconductor light-emitting device according to the embodiments (part 1)
Figure 3B:
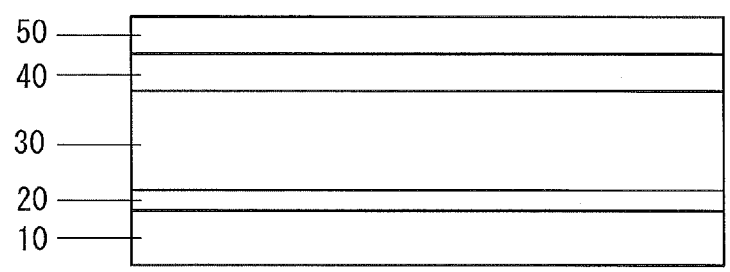
Figure 3C:
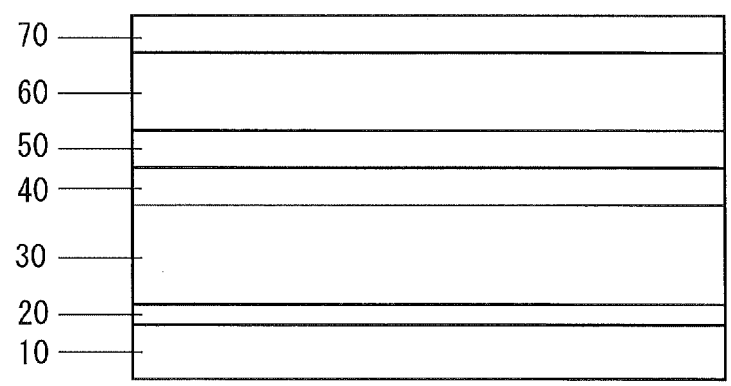

Next, the n-type contact layer 30 was formed on the low-temperature buffer layer 20 (see FIG. 3A). Then, the substrate temperature was elevated to 1,100° C. under a stream of hydrogen gas (carrier gas) and ammonia gas. After the substrate temperature had reached 1,100° C., TMG, ammonia gas, and silane gas (i.e., impurity gas) were supplied, to thereby form the n-GaN n-type contact layer 30 having an Si concentration of $4.5 \times 10^{18}/cm^3$.

3-3. Step of Forming n-Type ESD Layer

Subsequently, the n-type ESD layer 40 was formed on the n-type contact layer 30. The substrate temperature was lowered to 900° C., and an Si-doped n-GaN layer was formed. In this case, the growth temperature is preferably adjusted to 800° C. to 950° C. The n-GaN layer preferably has a characteristic value, as defined by the product of Si atomic concentration ($atom/cm^3$) and thickness (nm), of $0.9 \times 10^{20}$ to $3.6 \times 10^{20}$ ($atom \cdot nm/cm^3$).

3-4. Step of Forming n-Side Superlattice Layer

Next, the n-side superlattice layer 50 was formed on the n-type ESD layer 40. The n-side superlattice layer 50 was formed by depositing layer A (InGaN layer) having a thickness of 20 Å, layer B (GaN layer) having a thickness of 15 Å, and layer C (n-GaN layer) having a thickness of 7 Å in this order. Five layer units each including layers A, B, and C were sequentially deposited.

Specifically, the InGaN layer was formed under supply of TMG, TMI, and ammonia while the substrate temperature was maintained at 830° C. The GaN layer was formed under supply of TMG and ammonia while the substrate temperature was maintained at 830° C. The n-GaN layer was formed under supply of silane gas, TMG, and ammonia while the substrate temperature was maintained at 830° C. Thus, the layered structure shown in FIG. 3B was formed.

3-5. Step of Forming Light-Emitting Layer

Subsequently, the MQW layer 60 was formed on the n-side superlattice layer 50. The MQW layer 60 has a structure in which an InGaN layer (layer D) and an AlGaN layer (layer E) are alternately deposited in a repeated manner. The InGaN layer was grown at a growth temperature of 750° C. to 850° C. Raw material gases (i.e., TMI, TMG, and ammonia) were supplied for growth of the InGaN layer.

In this case, the In compositional proportion of layer D (InGaN layer) was adjusted to 20%. The thus-grown crystal layer has a thickness of 1 nm to 5 nm. Layer E (AlGaN layer) was grown at a growth temperature of 850° C. to 950° C. Raw material gases (i.e., TMA, TMG, and ammonia) were supplied for growth of layer E. The thus-grown crystal layer has a thickness of 1 nm to 6 nm.

3-6. Step of Forming p-Type Cladding Layer

Next, the p-type cladding layer 70 was formed on the MQW layer 60. The p-type cladding layer 70 has a structure in which a p-InGaN layer and a p-AlGaN layer are alternately deposited in a repeated manner. The p-InGaN layer (p-$In_{0.05}Ga_{0.95}N$ layer) having a thickness of 1.7 nm was formed under supply of $CP_2Mg$, TMI, TMG, and ammonia while the substrate temperature was maintained at 855° C.

The p-AlGaN layer having a thickness of 3.0 nm was formed under supply of $CP_2Mg$, TMA, TMG, and ammonia while the substrate temperature was maintained at 855° C. Thus, the layered structure shown in FIG. 3C was formed.

3-7. Step of Forming p-Type Contact Layer

Figure 4:
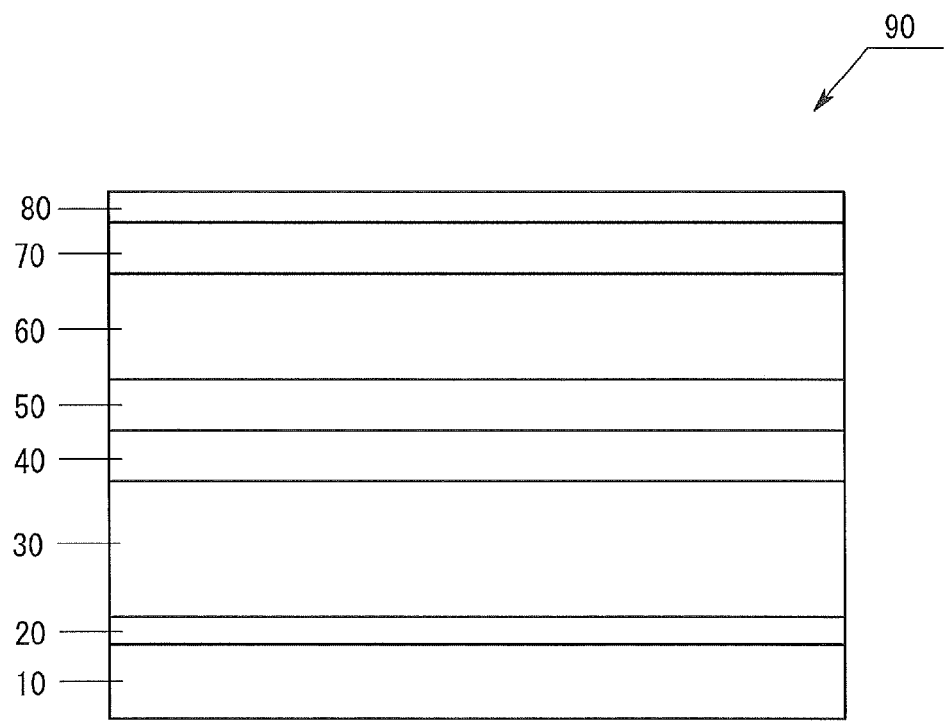
FIG. 4 is a diagram illustrating the method for producing the Group III nitride semiconductor light-emitting device according to the embodiments (part 2)

Subsequently, the p-type contact layer 80 was formed on the p-type cladding layer 70 (see FIG. 4). The p-type contact layer 80 was formed of p-GaN. A gas mixture of nitrogen and hydrogen was employed as a carrier gas. $CP_2Mg$, TMG, and ammonia were employed as raw material gases. The crystal growth temperature was adjusted to 900° C. to 1,050° C. The p-type contact layer 80 was doped with Mg at a concentration of $1 \times 10^{19}/cm^3$ to $1 \times 10^{22}/cm^3$.

3-8. Cooling Step

Next, the MOCVD furnace was cooled to ambient temperature in a nitrogen gas atmosphere. Specifically, the layered product 90 shown in FIG. 4 was cooled in an nitrogen gas atmosphere for preventing reincorporation of desorbed hydrogen into the layered product 90.

3-9. Electrode Formation Step

Subsequently, dry etching was performed from the top surface of the p-type contact layer 80, to thereby form a groove reaching a middle portion of the n-type contact layer 30. Then, the p-electrode P1 was formed on the p-type contact layer 80. The p-electrode P1 was formed by depositing, on the p-type contact layer 80, a Ni layer, an Au layer, and an Al layer in this order. The n-electrode N1 was formed on the thus-exposed portion of the n-type contact layer 30. The n-electrode N1 was formed by depositing, on the n-type contact layer 30, a Ni layer and an Au layer in this order.

3-10. Annealing Step

Next, the layered product 90 was subjected to thermal treatment (annealing) in a nitrogen atmosphere for the purpose of activating the above-doped Mg. This annealing step may be carried out before the electrode formation step or before the cooling step. Thus, the light-emitting device 100 shown in FIG. 1 was produced.

3-11. Produced Semiconductor Device

In the light-emitting device 100 produced through the aforementioned production steps, the In compositional proportion of the InGaN layer included in a layer unit of the n-side superlattice layer 50 gradually increases as the layer unit becomes distant from the n-type ESD layer 40 (i.e., the layer unit becomes proximate to the MQW layer 60). That is, the lattice constant of the InGaN layer (layer A) gradually increases from the side of the n-type ESD layer 40 to the side of the MQW layer 60.

Therefore, a new semiconductor layer exhibiting excellent crystallinity is likely to be grown on the already formed semiconductor layer. Thus, the light-emitting device 100 produced through the light-emitting device production method according to the present embodiment exhibits favorable crystallinity; i.e., the light-emitting device 100 exhibits excellent optical properties.

In the light-emitting device 100 produced through the aforementioned production steps, layer A (InGaN layer) of the n-side superlattice layer 50 has a low In compositional proportion. Therefore, the lattice constant of the layer A (InGaN layer) is almost equal to that of the GaN layer of the n-type ESD layer 40. Thus, strain is reduced at the interface between the n-type ESD layer 40 and the n-side superlattice layer 50.

4. Modifications 4-1. Layer A (InGaN Layer) of n-Side Superlattice Layer

In the present embodiment, layer A of the n-side superlattice layer 50 was formed of an InGaN layer having a thickness of 7 Å. The thickness was adjusted to fall within a range of 5 Å to 10 Å. However, the thickness of layer A (InGaN layer) may be adjusted to fall within a range of 10 Å to 50 Å. That is, layer A (InGaN layer) may have a thickness of 5 Å to 50 Å.

4-2. Layer C (n-GaN Layer) of n-Side Superlattice Layer

In the present embodiment, layer C of the n-side superlattice layer 50 was formed of a Si-doped n-GaN layer. However, layer C may be formed of a non-doped GaN layer.

4-3. Order of Depositing of Layers of n-Side Superlattice Layer

In the present embodiment, the n-side superlattice layer 50 was formed by depositing layer A, layer B, and layer C in this order from the lower side. However, the n-side superlattice layer 50 may be formed by depositing layer C, layer B, and layer A in this order.

4-4. AlGaN Layer of n-Side Superlattice Layer

An AlGaN layer may be provided in the n-side superlattice layer. In this case, an AlGaN layer may be replaced for a GaN layer or an n-GaN layer. Alternatively, an AlGaN layer may be provided in addition to a GaN layer and an n-GaN layer. In such a case, the number of layers forming a layer unit may be four or more.

4-5. Underlying Layer

In the present embodiment, the n-side superlattice layer 50 was formed on the n-type ESD layer 40. That is, the n-type ESD layer 40 serves as an underlying layer of the n-side superlattice layer 50. Needless to say, the underlying layer of the n-side superlattice layer 50 is not limited to the n-type ESD layer 40, and may be the n-type contact layer 30 or any other layer. However, the underlying layer must be formed of a Group III nitride semiconductor. The n-type ESD layer formation step corresponds to a step of forming the underlying layer of the n-side superlattice layer 50 (i.e., n-type ESD layer 40).

5. Summary of the Embodiment

As described above in detail, in the light-emitting device 100 according to the present embodiment, the In compositional proportion of an InGaN layer (layer A) of the n-side superlattice layer 50 is adjusted so that an InGaN layer more proximal to the MQW layer 60 has a higher In compositional proportion. The In compositional proportion of the InGaN layer 59A (which is most proximal to the MQW layer 60) of the n-side superlattice layer 50 is 70% to 100% of the In compositional proportion of the InGaN layer 61D (which is most proximal to the n-side superlattice layer) of the MQW layer 60. Thus, in the light-emitting device, stress applied to the MQW layer 60 can be relaxed.

The present embodiment is only an example, which should not be construed as limiting the present invention thereto. Therefore, needless to say, various modifications and variations may be made in the present invention without departing from the scope of the invention. In the present embodiment, the layered product 90 shown in FIG. 4 is employed. However, the structure of the layered product is not necessarily limited to one shown in FIG. 4. For example, any layered structure may be selected, or any number of layer units may be determined for forming each layer.

Crystal growth is not necessarily carried out through metal-organic chemical vapor deposition (MOCVD), and any other crystal growth method employing a carrier gas may be employed. The present invention can be applied to the case where an In-containing layer is employed. Therefore, the present invention may be applied to the case where an AlInGaN layer is employed. The present invention may be applied, in addition to the light-emitting device 100, to a semiconductor device for another application, so long as it is a Group III nitride semiconductor device.

Embodiment 2

1. Semiconductor Device

The light-emitting device according to Embodiment 2 has almost the same configuration as the light-emitting device according to Embodiment 1. The light-emitting device of Embodiment 2 differs from that of Embodiment 1 in terms of layer units of the n-side superlattice layer. The light-emitting device of Embodiment 2 is produced through almost the same production method as in the case of Embodiment 1. Therefore, the light-emitting device of Embodiment 2 will next be described by focusing on layer units of the n-side superlattice layer.

Figure 5:
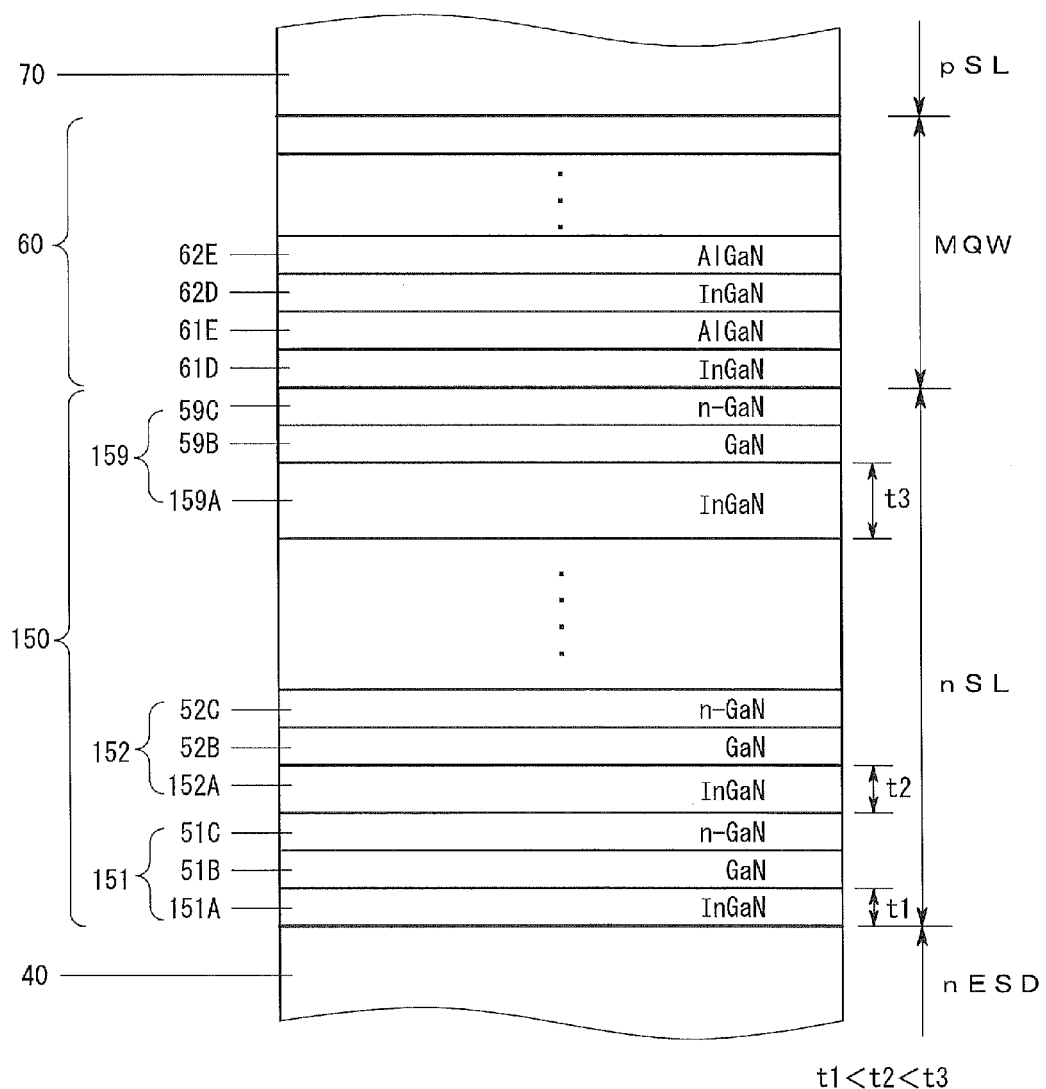
FIG. 5 is a diagram showing the layered structure of an n-side superlattice layer of a Group III nitride semiconductor device according to Embodiment 2.

2. n-Side Superlattice Layer 2-1. Layered Structure of n-Side Superlattice Layer FIG. 5 shows the n-side superlattice layer of the light-emitting device of Embodiment 2 and layers in the vicinity thereof. As shown in FIG. 5, the light-emitting device of Embodiment 2 includes the n-side superlattice layer 150. As in the case of Embodiment 1, the n-side superlattice layer 150 is formed by repeatedly depositing layer units 151 and 152 to 159.

The n-side superlattice layer 150 has the same configuration as the n-side superlattice layer 50 of Embodiment 1, except for the thickness of layer A (InGaN layer 151A and 152A to 159A). That is, the configuration of layer B (51B and 52B to 59B) or layer C (51C and 52C to 59C) of the n-side superlattice layer 150 is the same as in the case of Embodiment 1.

As shown in FIG. 5, layers A have different thicknesses. Specifically, the InGaN layer 151A has a thickness t1 of 7 Å; the InGaN layer 152A has a thickness t2 of 9 Å; and the InGaN layer 159A has a thickness t3 of 15 Å. That is, the thickness of layer A (InGaN layer) increases by 2 Å as it approaches the MQW layer 60. Thus, the thicknesses of the layers A satisfy the following relation: $t1 < t2 < t3$.

As described above, among the layers A (InGaN layers 151A and 152A to 159A), layer A more proximal to the MQW layer 60 has a larger thickness. Therefore, among the layers A, the InGaN layer 159A, which is most proximal to the MQW layer 60, has the largest thickness.

Thus, the amount of the InGaN layer included in each layer unit is increased by changing the thicknesses of layers A (InGaN layers 151A and 152A to 159A) so that layer A more proximal to the MQW layer 60 has a larger thickness. Therefore, a layer unit more proximal to the MQW layer 60 has more relaxed strain; i.e., stress applied to the MQW layer 60 is reduced.

2-2. In Compositional Proportion of Layer A (InGaN Layer) of n-Side Superlattice Layer As in the case of Embodiment 1, the InGaN layer 159A, which is most proximal to the MQW layer 60 among the layers A of the n-side superlattice layer 150, has the highest In compositional proportion.

The In compositional proportion of the InGaN layer 159A was adjusted to 90% of the In compositional proportion of the InGaN layer 61D (which is most proximal to the n-side superlattice layer 150) of the MQW layer 60. The In compositional proportion of the InGaN layer 159A may be 80% to 100% of the In compositional proportion of the InGaN layer 61D (which is most proximal to the n-side superlattice layer 150) of the MQW layer 60.

Since In compositional proportion is increased as described above, stress applied to the MQW layer 60 can be relaxed as in the case of Embodiment 1. In Embodiment 2, since layer thickness is also changed, stress applied to the MQW layer 60 is more effectively relaxed.

3. Modifications

In the present embodiment, layer C of the n-side superlattice layer 150 was formed of a Si-doped n-GaN layer. However, layer C may be formed of a non-doped GaN layer. In the present embodiment, the n-side superlattice layer 150 was formed by depositing layer A, layer B, and layer C in this order from the lower side. However, the n-side superlattice layer 150 may be formed by depositing layer C, layer B, and layer A in this order.

4. Summary of the Embodiment

As described above in detail, in the light-emitting device according to the present embodiment, the In compositional proportion of an InGaN layer (layer A) of the n-side superlattice layer 150 is adjusted so that an InGaN layer more proximal to the MQW layer 60 has a higher In compositional proportion. The In compositional proportion of the InGaN layer 159A (which is most proximal to the MQW layer 60) of the n-side superlattice layer 150 is 70% to 100% of the In compositional proportion of the InGaN layer 61D (which is most proximal to the n-side superlattice layer) of the MQW layer 60. In addition, the thickness of an InGaN layer (layer A) of the n-side superlattice layer 150 is adjusted so that an InGaN layer more proximal to the MQW layer 60 has a larger thickness. Thus, in the light-emitting device, stress applied to the MQW layer 60 can be relaxed.

The present embodiment is only an example, which should not be construed as limiting the present invention thereto. Therefore, needless to say, various modifications and variations may be made in the present invention without departing from the scope of the invention. In the present embodiment, the layered product 90 shown in FIG. 4 is employed. However, the structure of the layered product is not necessarily limited to one shown in FIG. 4. For example, any layered structure may be selected, or any number of layer units may be determined for forming each layer.

Crystal growth is not necessarily carried out through metal-organic chemical vapor deposition (MOCVD), and any other crystal growth method employing a carrier gas may be employed. The present invention can be applied to the case where an In-containing layer is employed. Therefore, the present invention may be applied to the case where an AlInGaN layer is employed. The present invention may be applied, in addition to a light-emitting device, to a semiconductor device for another application, so long as it is a Group III nitride semiconductor device.

Embodiment 3

Embodiment 3 will now be described. The semiconductor device of the present embodiment is similar to the light-emitting device 100 of Embodiment 1. Specifically, as in the case of Embodiment 1, in the n-side superlattice layer 50, an InGaN layer more distant from the n-type ESD layer 40 (i.e., more proximal to the MQW layer 60 (light-emitting layer)) has a higher In compositional proportion. The present embodiment employs a semiconductor device production method different from that employed in Embodiment 1.

1. Semiconductor Device Production Method

In the present embodiment, a characteristic feature resides in a method for forming the n-side superlattice layer 50. Therefore, next will be described only the difference between the production method employed in the present embodiment and that employed in Embodiment 1. The production method employed in the present embodiment differs from that employed in Embodiment 1 only in the n-side superlattice layer formation step.

1-1. Step of Forming n-Side Superlattice Layer

The n-side superlattice layer 50 was formed on the n-type ESD layer 40. The n-side superlattice layer 50 was formed by depositing layer A (InGaN layer) having a thickness of 20 Å, layer B (GaN layer) having a thickness of 15 Å, and layer C (n-GaN layer) having a thickness of 7 Å in this order. Five layer units each including layers A, B, and C were sequentially deposited.

Figure 6:
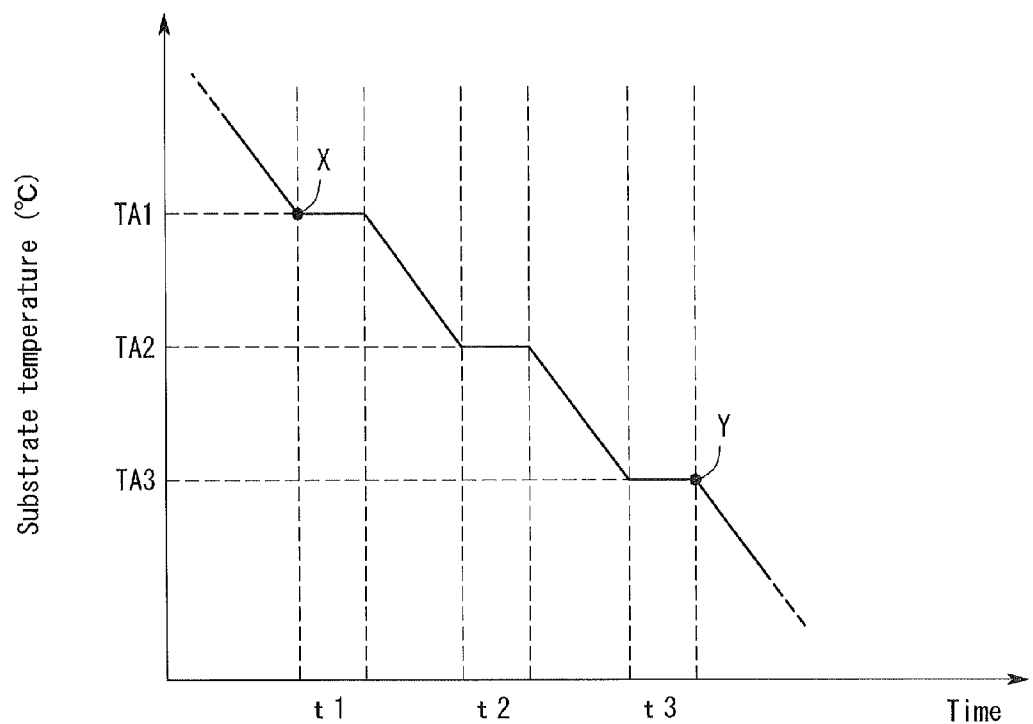
FIG. 6 shows is a graph showing a substrate temperature profile in a step of forming an n-side superlattice layer of a Group III nitride semiconductor device according to Embodiment 3.

Now will be described the substrate temperature employed in this step with reference to FIG. 6. The InGaN layer (A1) (which is most proximal to the n-type ESD layer 40) of the n-side superlattice layer 50 was formed under supply of TMG, TMI, and ammonia while the substrate temperature (TA1) was maintained at 830° C. The subsequent InGaN layer (A2) of the n-side superlattice layer 50 was formed while the substrate temperature (TA2) was maintained at 825° C. The subsequent InGaN layer (A3) of the n-side superlattice layer 50 was formed while the substrate temperature (TA3) was maintained at 820° C. That is, the substrate temperature employed for formation of an InGaN layer was lowered by 5° C. than that employed for formation of the preceding InGaN layer.

When the substrate temperature employed for formation of an InGaN layer is lower. In is more likely to enter a GaN layer. Thus, when an InGaN layer is grown at a lower substrate temperature, the thus-grown InGaN layer has a higher In compositional proportion.

For formation of a GaN layer, TMG and ammonia were supplied. The substrate temperature employed for formation of the GaN layer is equal to that employed for forming the InGaN layer immediately before the GaN layer formation. For formation of an n-GaN layer, silane gas, TMG, and ammonia were supplied. The substrate temperature employed for formation of the n-GaN layer is equal to that employed for forming the InGaN layer immediately before the n-GaN layer formation. That is, the layers of the layer unit 51 are formed at the same temperature. The substrate temperature employed for formation of the layer unit 52 on the layer unit 51 is lower by 5° C. than that employed for formation of the layer unit 51. That is, the substrate temperature employed for formation of a layer unit is lowered by 5° C. than that employed for formation of the preceding layer unit. Thus, the layered structure shown in FIG. 3B was formed.

2. Modifications 2-1. Temperature Profile

In the present embodiment, when formation of one InGaN layer was completed in the n-side superlattice layer 50, the substrate temperature was lowered by 5° C. Needless to say, the temperature difference (TA1−TA2) may be 5° C. or more.

No particular limitation is imposed on the substrate temperature profile, so long as the substrate temperature is gradually lowered from the temperature X employed for formation of the first InGaN layer of the n-side superlattice layer 50 to the temperature Y employed for formation of the last InGaN layer of the n-side superlattice layer 50. However, as shown in FIG. 6, the substrate temperature is preferably maintained constant during the period t1 for InGaN layer formation. The same shall apply to the period t2 or t3.

2-2. In Flow Rate

In the present embodiment, an InGaN layer more proximal to the light-emitting layer was grown at a lower substrate temperature. However, in place of or in addition to lowering the substrate temperature, the flow rate of In supplied to the substrate 10 may be increased. In this case, the In compositional proportion of an InGaN layer can be adjusted so that an InGaN layer more proximal to the light-emitting layer has a higher In compositional proportion. Thus, strain can be relaxed. That is, the thus-produced semiconductor device exhibits improved light emission performance.

What is claimed is:

1. A Group III nitride semiconductor light-emitting device comprising:
an underlying layer formed of a Group III nitride semiconductor;
a strain relaxation layer formed on the underlying layer; and
a light-emitting layer formed on the strain relaxation layer, wherein the light-emitting layer is formed by depositing a barrier layer and an In-containing well layer;
the strain relaxation layer is formed of a superlattice layer including three or more layer units, each unit including at least an InGaN layer and a GaN layer; and
among the layer units, a layer unit more proximal to the light-emitting layer includes an InGaN layer having a higher In compositional proportion, and the layer unit most proximal to the light-emitting layer includes an InGaN layer having an In compositional proportion which is 70% to 100% of the In compositional proportion of the well layer of the light-emitting layer.

2. A Group III nitride semiconductor light-emitting device according to claim 1, wherein, in the layer units, an InGaN layer more proximal to the light-emitting layer has a larger thickness.

3. A Group III nitride semiconductor light-emitting device according to claim 1, wherein the GaN layers of all the layer units have the same thickness.

4. A Group III nitride semiconductor light-emitting device according to claim 1, wherein the layer of the layer units that is in contact with the light-emitting layer is an n-GaN layer.

5. A Group III nitride semiconductor light-emitting device according to claim 1, wherein the layer of the layer units that is in contact with the underlying layer is an InGaN layer.

6. A Group III nitride semiconductor light-emitting device according to claim 1, wherein the layer units include an AlGaN layer.

7. A Group III nitride semiconductor light-emitting device according to claim 1, wherein the underlying layer is a layer for preventing electrostatic breakdown of each semiconductor layer.

* * * * *